United States Patent
Evans et al.

(10) Patent No.: US 8,906,727 B2
(45) Date of Patent: Dec. 9, 2014

(54) HETEROEPITAXIAL GROWTH USING ION IMPLANTATION

(75) Inventors: Morgan D. Evans, Manchester, MA (US); Chi-Chun Chen, Gloucester, MA (US); Cheng-Huang Kuo, Tainan (TW)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 179 days.

(21) Appl. No.: 13/517,535

(22) Filed: Jun. 13, 2012

(65) Prior Publication Data

US 2013/0020580 A1 Jan. 24, 2013

Related U.S. Application Data

(60) Provisional application No. 61/497,744, filed on Jun. 16, 2011.

(51) Int. Cl.
| | |
|---|---|
| *H01L 21/00* | (2006.01) |
| *C30B 23/02* | (2006.01) |
| *C30B 29/40* | (2006.01) |
| *C30B 25/18* | (2006.01) |

(52) U.S. Cl.
CPC .............. *C30B 23/025* (2013.01); *C30B 29/403* (2013.01); *C30B 25/186* (2013.01)
USPC .................................. 438/46; 438/39; 438/40

(58) Field of Classification Search
None
See application file for complete search history.

(56) References Cited

U.S. PATENT DOCUMENTS

| | | | |
|---|---|---|---|
| 5,363,793 A | | 11/1994 | Sato |
| 7,378,684 B2 * | | 5/2008 | Linthicum et al. ............... 257/76 |
| 2003/0207580 A1 | | 11/2003 | Li et al. |
| 2004/0259336 A1 * | | 12/2004 | Yeh et al. ....................... 438/585 |
| 2005/0176217 A1 | | 8/2005 | Tseng et al. |
| 2007/0163489 A1 | | 7/2007 | Son et al. |
| 2009/0104726 A1 * | | 4/2009 | Slater et al. ..................... 438/45 |
| 2010/0252805 A1 * | | 10/2010 | Chu et al. ......................... 257/11 |
| 2011/0168973 A1 * | | 7/2011 | Ahn et al. ........................ 257/13 |

FOREIGN PATENT DOCUMENTS

WO 2007032802 A2 3/2007

OTHER PUBLICATIONS

"Heteroepitaxial growth of GaAs films on Si substrates using ion beams, neutral molecular beams, and their mixtures" Katsuhiro Yokota, Susumu Tamura, Thin Solid Films, vol. 349, Issues 1-2 Jul. 1999, pp. 84-92.*
Cho, Yong Suk, et al., Effects of N+ -implanted sapphire(0001)substrate on GaN epilayer, Journal of Crystal Growth 236, 2002, pp. 538-544, Elsevier, Amsterdam, The Netherlands.
Sawaki, Nobuhiko, et al., Growth and Properties of Semi-Polar GaN on a Patterned Silicon Substrate, Journal of Crystal Growth 311, 2009, pp. 2867-2874, Elsevier, Amsterdam, The Netherlands.
Hiramatsu, Kazumasa, Epitaxial Lateral Overgrowth Techniques Used in Group III Nitride Epitaxy, Journal of Physics: Condensed Matter 13, 2001, pp. 6961-6975, Institute of Physics Publishing, United Kingdom.

* cited by examiner

*Primary Examiner* — Charles Garber
*Assistant Examiner* — Brigitte Paterson

(57) ABSTRACT

In one embodiment, a method of growing a heteroepitaxial layer comprises providing a patterned substrate containing patterned features having sidewalls. The method also includes directing ions toward the sidewalls in an exposure, wherein altered sidewall regions are formed, and depositing the heteroepitaxial layer under a set of deposition conditions effective to preferentially promote epitaxial growth on the sidewalls in comparison to other surfaces of the patterned features.

24 Claims, 12 Drawing Sheets

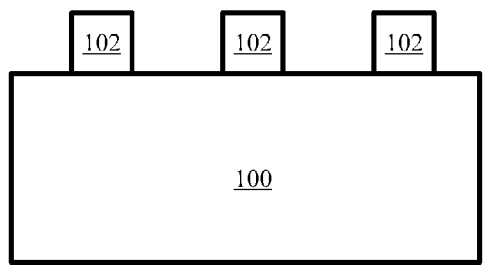
FIG. 3a
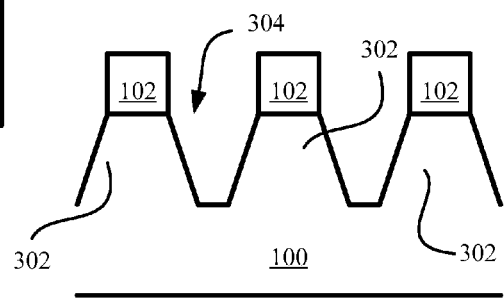
FIG. 3b
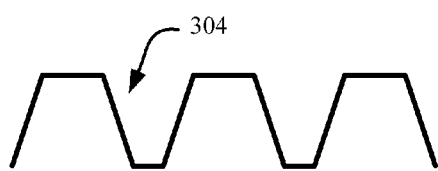
FIG. 3c
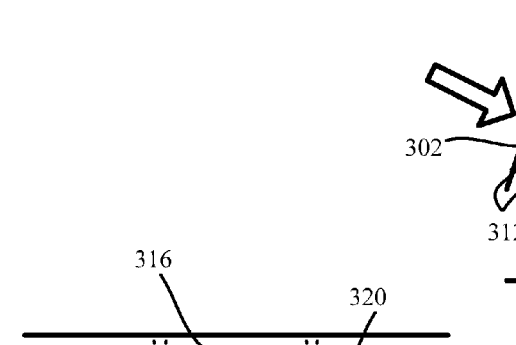
FIG. 3d
FIG. 3e

HETEROEPITAXIAL GROWTH USING ION IMPLANTATION

This application claims priority from U.S. provisional patent application No. 61/497,744 filed Jun. 16, 2011 and incorporated by reference herein in its entirety.

FIELD OF THE DISCLOSURE

This invention relates to ion implantation and, more particularly, to ion implantation to improve compound semiconductor growth.

BACKGROUND OF THE DISCLOSURE

It is the goal for many commercial applications to improve the quality of crystalline substrates, such as semiconductor substrates, and in particular compound semiconductors. Unlike materials such as silicon, which can be grown from the melt at relatively low cost in bulk single crystalline form, many compound semiconductors are fabricated by epitaxial growth of layers on single crystalline substrates. Often substrates such as silicon and sapphire are used to grow other single crystalline materials because of the high quality of the silicon or sapphire substrate. However, such heteroepitaxial processes still suffer from problems inherent in hetereoepitaxy.

In one important example, gallium nitride (GaN) is a material commonly grown on substrates for use in light-emitting diodes (LEDs). The ability to grow high-quality GaN is one limiting factor to improving the quality and lowering the cost of these devices. GaN growth on sapphire or silicon substrates typically exhibits crystal faults called threading dislocations or "threads." These threading dislocations may be caused by the lattice size mismatches or thermal expansion mismatches between the GaN and the substrate. Threading dislocations can lead to poor efficiency, reliability, or lifetime in an LED due to poor conductivity. What is needed is an improved method of growing materials such as compound semiconductors and, more particularly, growing GaN. In particular, improved heteroepitaxy processes are needed.

SUMMARY

This Summary is provided to introduce a selection of concepts in a simplified form that are further described below in the Detailed Description, and is not intended to identify key features or essential features of the claimed subject matter, nor is it intended as an aid in determining the scope of the claimed subject matter. In one embodiment, a method of growing a heteroepitaxial layer comprises providing a substrate containing patterned features having sidewalls. The method also includes directing ions toward the sidewalls in an exposure, wherein altered sidewall regions are formed, and depositing the heteroepitaxial layer under a set of deposition conditions effective to preferentially promote epitaxial growth on the sidewalls in comparison to other surfaces of the patterned features.

In another embodiment, a light emitting diode device includes a substrate comprising a first material patterned into a two-dimensional array of peaked features having sidewalls, the peaked features having implanted regions that include implanted species dispersed within the first material, and a device component comprising an epitaxial layer disposed on the patterned substrate, the epitaxial layer comprising a plurality of initial growth regions, each initial growth region disposed adjacent a sidewall of a peaked feature.

BRIEF DESCRIPTION OF THE DRAWINGS

FIGS. 3a-3e depict another exemplary method;
FIGS. 10b-10c depicts two different scenarios for use of the apparatus of FIG. 10a.

DETAILED DESCRIPTION

Figure 1A:
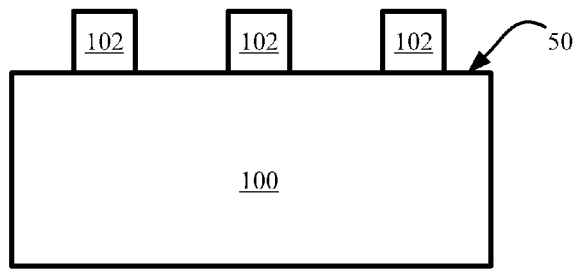
FIGS. 1a-1e depict an exemplary method.

The embodiments described herein may focus on growth of a compound semiconductor such as GaN, but these embodiments also may be used with other III/V compound semiconductors, group IV semiconductors, II/VI compound semiconductors, or other materials known to a person skilled in the art. While a specific type of implanter is disclosed, other ion implantation systems known to those skilled in the art that can focus an ion beam or that can implant particular regions of a substrate with or without a mask on the substrate may be used in the embodiments described herein. For example, plasma doping or beamline ion implanters also may be used. While LEDs are specifically disclosed, other devices also may benefit from the embodiments described herein. The substrates herein may be silicon, sapphire, or other materials and may include a coating or other layers in some instances. Thus, the invention is not limited to the specific embodiments described below.

Consistent with the present embodiments, ion implantation is performed into patterned single crystalline substrates, which may lead to improved processes for fabricating LEDs, as well as improved LED quality. The terms "single crystalline" or "monocrystalline" as used herein both refer to an object such as a wafer or other substrate that constitute a single crystal, in contrast to polycrystalline materials, which are objects that contain multiple crystallites. Examples of such patterned single crystalline substrates (PSCS) include patterned sapphire substrates, patterned silicon substrates, patterned silicon carbide substrates, and patterned nitride substrates. The present embodiments are not limited in this context. As used herein, the term PSCS includes those substrates, such as patterned sapphire substrates and patterned silicon substrates, both of which have been conventionally referred to by the acronym "PSS." More particularly, the present embodiments facilitate heteroepitaxial growth on PCSC, in which a crystalline layer that is grown differs chemically from the substrate upon which the crystalline layer forms. Examples of such hetereoepitaxy include gallium nitride deposited on sapphire or gallium nitride deposited on silicon. The present embodiments are not limited in this context. The terms "gallium nitride material" or "Ga:N material" as used herein, unless otherwise noted, may refer to the compound GaN, but may also refer to ternary compounds (or quaternary compounds) that include gallium and nitrogen, such as AlGaN, InGaN, and the like. Moreover, as will be appreciated by those of ordinary skill, such grown materials may include dopants, such as magnesium or carbon (in the case of p-type doping) and silicon (in the case of n-type doping), and may typically have the same crystallographic structure as GaN.

Unlike conventional processing using PSS substrates to form crystalline layers, the present embodiments employ ion implantation in conjunction with PSCS substrates, which facilitates better processing for fabricating heteroepitaxially grown layers. As detailed below, by applying novel combinations of ion processing and PSS structures during fabrication of a layer, such as a compound semiconductor, the properties and quality of the layer can be tailored. Some embodiments may employ ion implantation using conventional PSS substrates while other embodiments may tailor the PSS substrate structure in conjunction with ion implantation.

FIGS. 1a-1e depict exemplary features of a method for fabricating a heteroepitaxial layer consistent with the present embodiments. The figures illustrate a substrate in cross-section, which, for purposes of illustration, is referred to as a PSS substrate, but may be, to name other non-exclusive examples, a patterned silicon carbide substrate or patterned nitride. In some embodiments, the PSS 100 may be a sapphire wafer that has a diameter of 2", 4", or 6" or a larger diameter or a silicon wafer of any convenient diameter. Such unpatterned wafers are typically characterized by opposing surfaces, at least one of which may be polished and may generally define a plane before processing to form a device. As shown in FIG. 1a, the PSS 100 initially has a surface 50 upon which a set of mask features 102 are deposited. The set of mask features 102 may be a patterned photoresist layer in some embodiments, while in other embodiments, the set of mask features may be a patterned oxide, nitride, or other hard mask material.

Figure 1B:
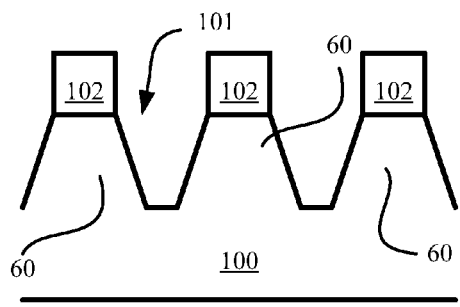

Consistent with the present embodiments, as illustrated in FIG. 1b, the PSS is etched with the set of mask features disposed on the surface 50, wherein multiple valleys 101 are formed by etching. As illustrated, the multiple valleys define a set of features 60, which generally may be arranged in a two dimensional array. Examples of PSS arranged in two dimensional arrays are illustrated below with respect to FIGS. 2a-2d. The etch process of FIG. 1b may be performed according to known techniques. For example, in embodiments in which the set of mask features 102 are photoresist, a conventional dry etch process, such as plasma etching, may be performed to define the valleys 101 and features 60. In examples in which the set of mask features 102 are an oxide hard mask, a conventional wet etch process may be performed instead. For example, in embodiments in which PSS 100 is sapphire, a high temperature sulfuric acid/phosphoric acid etch may be performed.

Figure 1C:
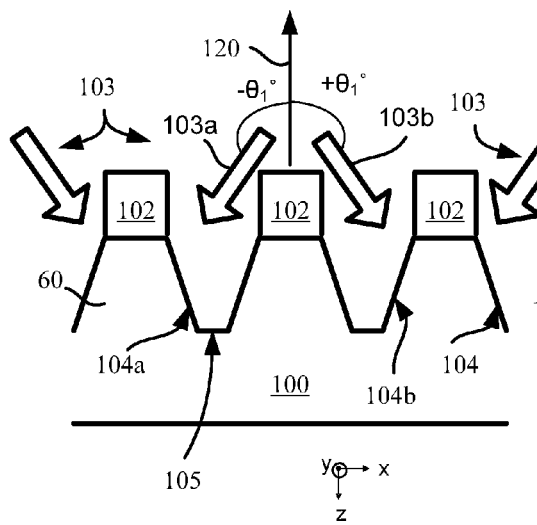
Figure 1D:
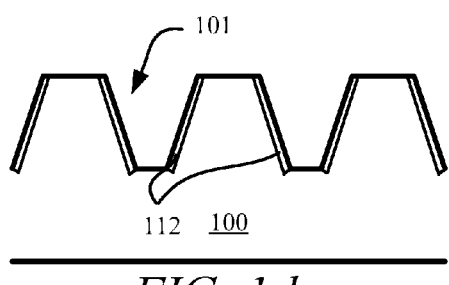
Figure 1E:
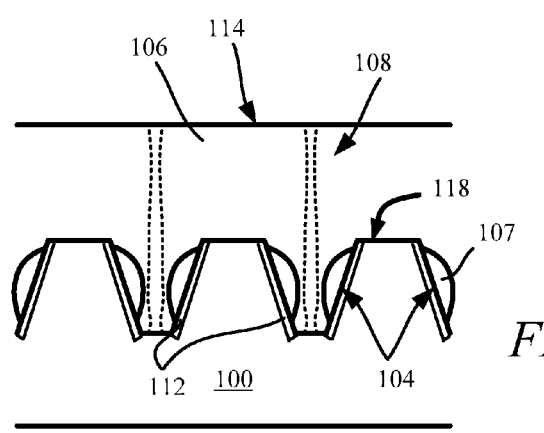
Figure 2A:
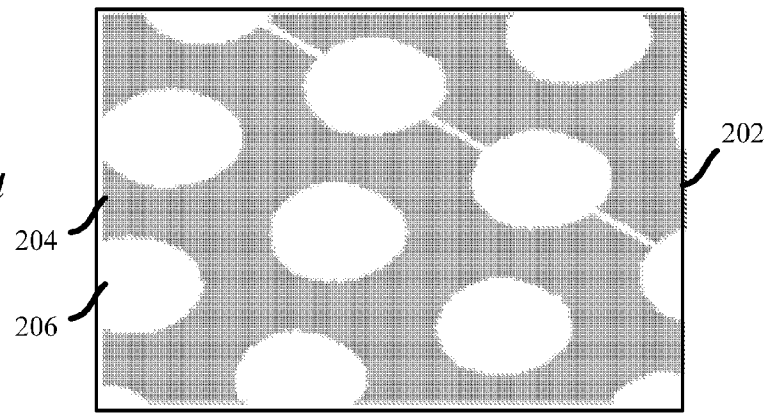
FIGS. 2a-2d depict two example substrates.
Figure 2B:
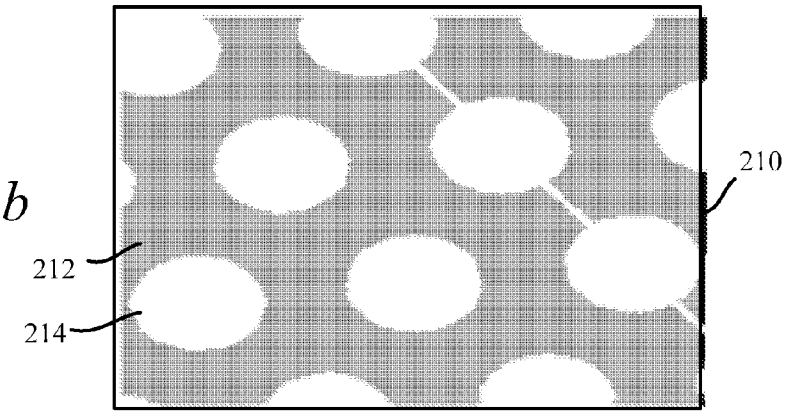

Turning now to FIGS. 2a-2d, there are shown different PSS substrates that may be employed in the embodiments generally depicted in FIGS. 1a-1e. FIGS. 2a and 2b depict a plan view of two different PSS 202 and 210. Each PSS 202, 210 is defined by respective valleys 204, 212 that separate a respective two dimensional array of features 206, 214. In each case, as further illustrated in FIGS. 2c-2f, the features 206, 214 are shaped as sloping peaks and are approximately 2.5 µm to 2.7 µm in diameter. The width of the valleys 204, 212 between peaks is about 0.9 to 1.1 µm. Notably, the features 206, 214 may be representative of features formed after a dry etch process.

Figure 2C:
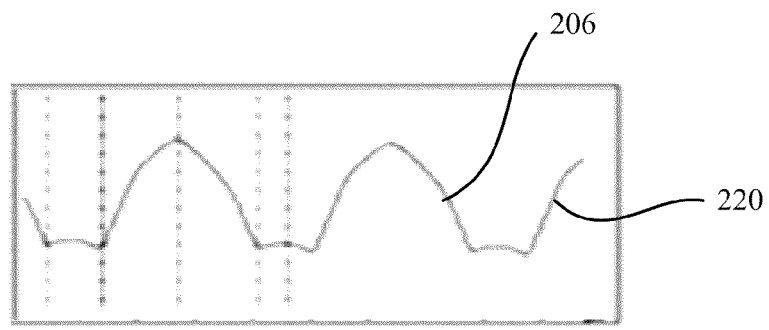
Figure 2D:
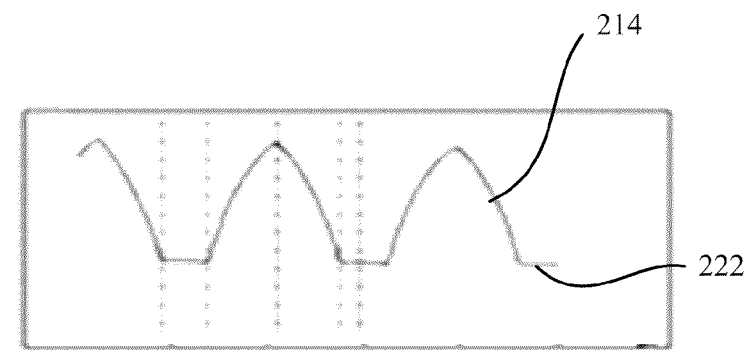

FIGS. 2c and 2d depict respective one dimensional profiles 220, 222 for the PSS 202, 210. As measured by the profiles, the height of features 206 is about 1.1 µm to 1.3 µm and height of features 214 is approximately 1.1 µm to 1.3 µm. As illustrated the tops of the features 214 are somewhat more pointed than those of features 206. Of course, in other embodiments, other feature dimensions and shapes are possible. For example, if a wet etch process is used to form a PSS structure, the shape of the features may be determined by characteristic crystallographic planes that may be revealed during etching and may form at least a portion of the feature sidewalls. In various embodiments the spacing between features 206 may range between about 1 µm to 5 µm.

As is known in the art, PSS, such as those depicted in FIGS. 2a-2d, may be used to grow layers, such as gallium nitride layers for the purposes of forming a light emitting diode (LED) chip. The PSS may particularly enhance the light extraction efficiency (LEE) from the LED chip by scattering the light confined in the gallium nitride layer attributed to the critical angle between GaN (n=2.4) and a sapphire substrate (n=1.7) (or air (n=1.0)). However, even using PSS type substrates, prior art growth processes may lead to the presence of excessive threading dislocations in gallium nitride layers grown thereon, which can lead to poor efficiency, reliability, or lifetime in such an LED.

The present embodiments address this problem by providing techniques for that are more efficient and may lead to less defective epitaxial growth on structures such as those generally depicted in FIGS. 2a-2d. In particular, in the present embodiments, species are implanted into one or more portions of a PSS, which results in altering the manner of growth of a heteroepitaxial layer deposited on the PSS in a manner that may improve the quality of the heteroepitaxial layer. The species may be ions or energetic neutrals in some examples, but are generally referred to hereinafter as "ions." Returning to FIG. 1c, there is shown an example of a process in which ions are implanted into the PSS 100. In particular, ions 103 are directed toward and are implanted into the sidewalls 104, as illustrated by the open arrows. In one instance, the ions 103 constitute nitrogen, though aluminum, oxygen, phosphorus, arsenic, argon or other materials may be used. Nitrogen, phosphorus, arsenic, or other species may promote GaN growth on sapphire. The doses of these or other species may be configured to promote GaN growth. In one instance, the dose is below that which amorphizes the PSS 100. In one instance, ions 103 are implanted between about 5 keV to 150 keV and at a dose between approximately 1 E14 cm$^{-2}$ to 5 E16 cm$^{-2}$. This may form an altered region on the sidewall having an altered atomic structure and composition of $1\times10^{20}/cm^3$ to $1\times10^{22}/cm^3$ of implanted species in some embodiments.

The implanting of ions 103 are schematically shown in FIG. 1c as being directed at different angles. In various embodiments, the ions 103 may be implanted in one step or in multiple steps. A portion of the ions 103 may be directed generally at one set of sidewalls 104, while another portion of the ions 103 is directed at another set of sidewalls 104. For example, the ion(s) 103a are directed toward sidewall 104a, which faces a first direction, while the ions 103b are directed at a second sidewall 104b, which faces a second, different direction than sidewall 104a. Referring also to the Cartesian x-y-z coordinate system of FIG. 1c, the sidewalls 104a and 104b generally define opposite angles with respect to a perpendicular 120 to the substrate plane of PSS 100, where the perpendicular lies along the z-direction. It is to be noted that the sidewalls 104 are illustrated as planar, however, the sidewalls 104 need not be planar, but may be curved or may define multiple planes. In particular embodiments, ions 103a may form an angle $-\theta_1°$ that has the same magnitude with respect to the perpendicular 120 as the angle $+\theta_1°$ defined by ions 103b.

More generally, the ions 103 may be distributed over a range of angles, even in a single exposure. For example, the plasma processing apparatus of FIG. 10a or other systems that can produce a wide beam angle distribution, may be used to produce the ions 103 over a range of angles.

In the embodiment illustrated at FIG. 1c, the set of mask features 102 protects the tops of the PSS features 60. Consistent with various embodiments, the ions 103 are also angled to preferentially implant into the sidewalls 104 instead of the bases 105 of the valleys 101. Thus, even though the bases 105 are exposed, the angle of incidence of ions 103, such as $-\theta_1°$, may be selected to provide trajectories that are shadowed by the features 60 and set of mask features 102 such that few, if any, ions 103 directly impinge on the bases 105.

Subsequently, as illustrated at FIG. 1d, the $s_e$t of mask features 102 is removed, leaving a novel PSS having altered sidewall regions 112. An epitaxial layer of material is then grown on the novel PSS structure, as illustrated in FIG. 1e. As shown therein a layer 106 is grown on the PSS 100. The layer 106 may be grown to a thickness that is sufficient to create a continuous and planar layer. The layer 106 may thus have a surface 114 that is planarized. For PSS substrates where features 60 have a thickness (depth along the z-direction) of about 1 μm, the thickness of layer 106 may be about 2 μm to 5 μm. The embodiments are not limited in this context.

As further illustrated in FIG. 1e, an initial growth region 107 forms along each sidewall 104. This initial growth region 107 was enhanced by the implantation performed in FIG. 1c, which leads to the formation of the altered sidewall regions 112. The altered sidewall regions 112 may enhance growth along the sidewalls 104 in various manners. For example, a material such as GaN may preferentially grow larger and/or more perfect crystallites, which may also form more readily when sidewalls 104 are implanted with a particular ion exposure, leading to altered regions that have a changed structure and/or composition. Lateral growth of a GaN layer may be larger than other types of growth in one embodiment of layer 106.

In particular embodiments, nitrogen may be implanted into sidewalls to form altered sidewall regions 112 that constitute a nitride phase at the surface of the sidewalls. For example, implanted nitrogen may induce formation of a thin aluminum nitride layer in a sidewall of a sapphire PSS. This thin layer may reduce the misfit strain of a subsequently grown GaN layer (an embodiment of layer 106), leading to fewer threading dislocations in the layer 106.

Thus, initial growth of the layer 106 may be selectively promoted along the sidewalls 104, which may lead to a superior heteroepitaxy process. While the layer 106 is depicted as having threads 108 in FIG. 1e (represented by dotted lines), these threads 108 are reduced in number compared to a conventional heteroepitaxial growth process for growing a layer on a non-implanted PSS 100. In one instance, the threads 108 are reduced compared to a process using non-implanted PSS 100 by an order of magnitude for embodiments in which the layer 106 is GaN. In another instance, the threads 108 may be completely avoided in layer 106.

In various embodiments, the growth conditions, such as in a metal organic chemical vapor deposition (MOCVD) tool, may be optimized to promote GaN growth on the sidewalls 104 that were implanted. For example, pressure and temperature may be changed in an MOCVD tool to promote GaN growth on the implanted regions. More particularly, while in some embodiments the growth process depicted in FIG. 1e may employ pressure and temperature conditions in an MOCVD tool the same as for conventional unimplanted PSS, in other embodiments the pressure and/or temperature may be adjusted up or down with respect to parameters used for MOCVD on unimplanted PSS.

An advantage of the process generally depicted in FIGS. 1a-1e is that a set of mask features 102 may be used both as an etch mask to protect portions of the PSS 100 so as to define the features 60 during etching, and also as an implant mask that screens the ions 103 from striking portions of the PSS 100. For example, referring again to FIGS. 1c and 1e, the tops 118 of features 60 are screened by the set of mask features 102 so that fewer ions 103 impinge on the tops 118 as compared to the sidewalls 104. In this manner, little of no altered region is created on the tops 118, such that growth of layer 106 is not enhanced on tops 118. By selectively controlling the regions of PSS 100 where epitaxial growth is to be promoted, the microstructure and thereby electronic properties of the layer 106 may be improved.

However, in other embodiments, the etch mask (as represented by mask features 102) may be removed before ion implantation of sidewalls of features 60. FIGS. 3a-3e depict one such embodiment. In FIG. 3a, a set of mask features 102 is provided on the PSS 100. In FIG. 3b, the PSS 100 is etched to form the PSS structure as generally described above with respect to FIG. 1b. However, it may be desirable to alter the etching with respect to that performed in the embodiments in which the set of mask features 102 remain in place during ion implantation. For example, the depth of the features 302 or valleys 304 formed by etching of the PSS 100 may be greater than or less than the depth of the masked features 60 in FIG. 1b. Subsequently, as illustrated in FIG. 3c, the set of mask features 102 is removed.

After removal of the set of mask features 102, ions 306 represented by the arrows are directed toward the sidewalls 308. In various embodiments, the ions 306 may comprise an ion energy and/or ion dose similar to that described above with respect to FIGS. 1a-1e. The trajectory of ions 306 may likewise be arranged such that the ions 306 implant along at least portions of the sidewalls 308 while being screened from impinging upon the bases 310 of the valleys 304. In this manner, the sidewalls 308 may be preferentially altered to form altered sidewall regions 312 that are similar to the altered sidewall regions 112. Moreover, even though the tops 314 of the features 302 are exposed to the ions 306, the ion trajectories of ions 306 may be such that the tops 314 sustain less alteration than that of the sidewalls 308.

Subsequently, as shown in FIG. 3e, an epitaxial layer of material is grown on the novel PSS structure. As shown therein a layer 316 is grown on the PSS 100. As further illustrated in FIG. 3e, an initial growth region 318 in the layer 316 forms along each sidewall 308. This initial growth region 318 is enhanced by the implantation performed in FIG. 3d, which leads to the formation of the altered sidewall regions 312. As in the embodiment illustrated in FIGS. 1a-1f, initial growth of the layer 316 may be selectively promoted along the sidewalls 308 in preference over growth in regions proximate the bases 310 and tops 314, which may lead to a superior heteroepitaxy process. While the layer 316 is depicted as having threads 320 in FIG. 3e these threads 320 may also be reduced in number compared to a conventional heteroepitaxial growth process for growing a layer on a non-implanted PSS 100.

Figure 4A:
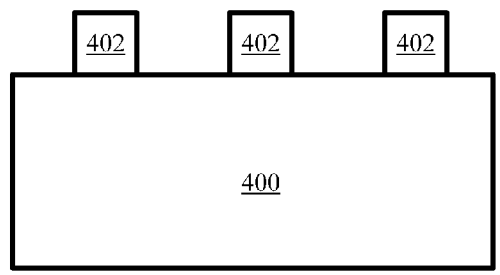
FIGS. 4a-4d depict a further exemplary method.
Figure 4B:
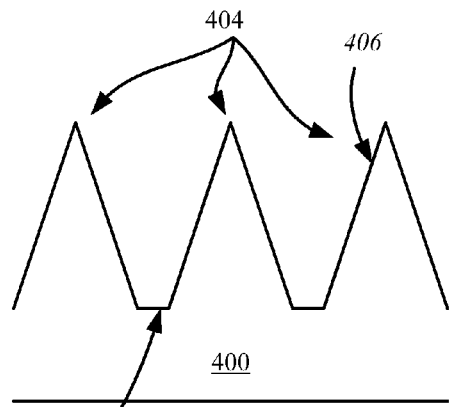
Figure 4C:
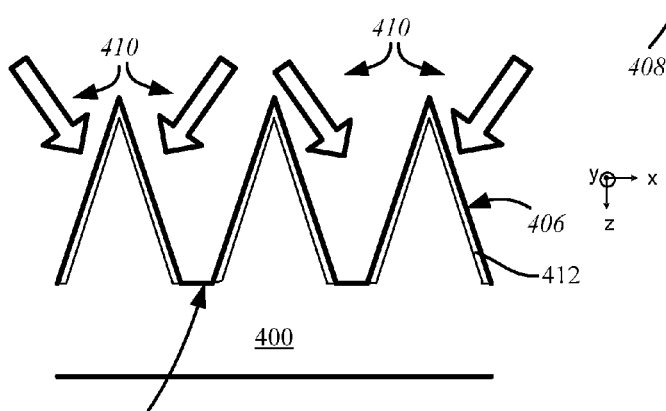
Figure 4D:
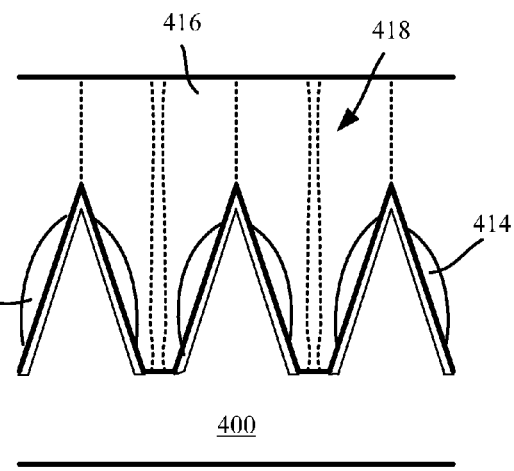

In further embodiments, the peaked features of a PSS are tailored to reduce the size of top portions of the peaks before implantation. FIGS. 4a-4d depict exemplary features of another embodiment in which a PSS structure is produced having peaked features 404 that exhibit a pointed structure. In FIG. 4a, a set of mask features 402 is provided on a substrate 400. The set of mask features 402 may be photoresist or may be a hardmask material in some embodiments. The set of mask features 402 are used to selectively mask the substrate 400 during an etch process to define a set of features to be used as a template for heteroepitaxial growth. In FIG. 4b, there is shown the substrate 400 after an etch process is performed. The substrate 400 includes a set of peaked features 404 that include sidewalls 406 and are separated by bases 408. As generally illustrated in FIG. 4b the peaked features 404 may be etched to the extent that opposing sidewalls within a peaked feature 404 merge. In FIG. 4c, ions 410 represented by the arrows are directed toward the sidewalls and implant into the sidewalls 406, forming altered sidewall regions 412. In some embodiments, the height of peaked features 404 along the z-direction may exceed that of the features 60 for a common starting set of mask features 402. The sidewalls 406 may therefore cover a greater area than the sidewalls 104 of the features 60 shown in FIGS. 1b-1e. Accordingly, the altered sidewall regions 412 may also extend over a larger surface area than altered sidewall regions 112. Subsequently, an epitaxial growth process is performed to grow a layer on the substrate 400. FIG. 4d illustrates the structure after epitaxial growth. As illustrated, initial growth regions 414 are disposed on the altered sidewall regions 412. Continued epitaxial growth may result in a continuous layer, such as layer 416 illustrated in FIG. 4d. Because the initial growth regions 414 may extend along relatively longer sidewalls in comparison to the sidewalls 104, the overall heteroepitaxial process to form the layer 416 may differ from that illustrated in the embodiment of FIG. 1a-1e, for example, which may lead to a lower density of threads 418 in comparison to that of threads 108.

Figure 5A:
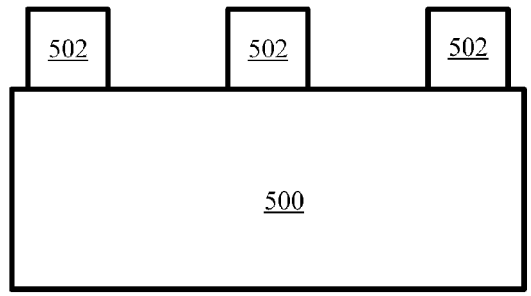
FIGS. 5a-5c and 6a-6c respectively depict two variants of the method of FIGS. 4a-4d.
Figure 5B:
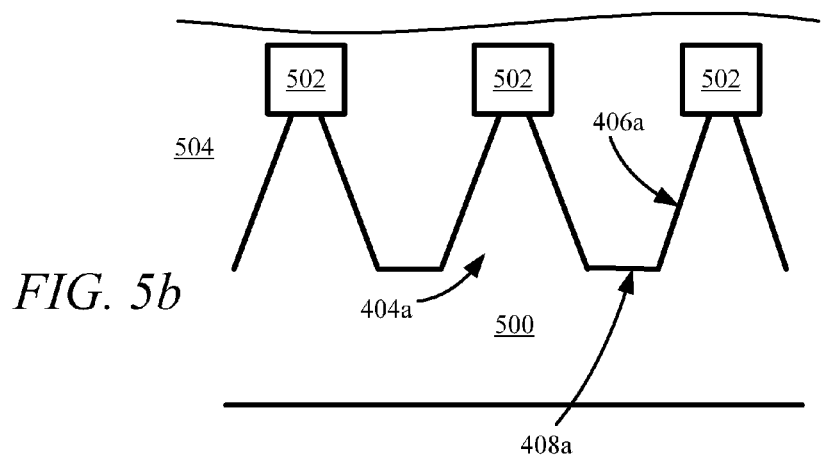
Figure 5C:
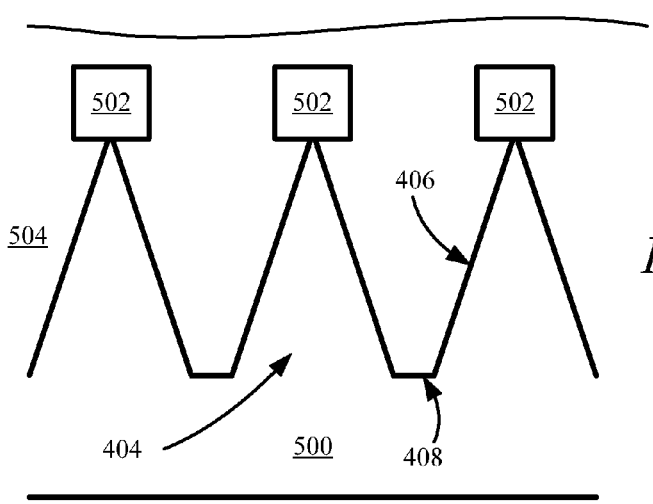

FIGS. 5a-5c depict exemplary processes involved in a variant of the embodiment depicted in FIGS. 4a-4d. In particular, the process of FIGS. 5a-5c depicts details of the evolution of the peaked features 404 of FIG. 4b. In FIG. 5a, a substrate 500 is patterned with a set of mask features 502 that are designed to withstand a wet chemical etching process. The set of mask features 502 may be an oxide material in one example. In FIG. 5b, the substrate 500 including the set of mask features 502 is subjected to etching in a liquid etchant 504. As illustrated, the liquid etchant etches the substrate 500 to define the peaked features 404a, which have sloping sidewalls 406a and are separated by bases 408a. The sidewalls 406a of each peaked feature 404a have not merged. In the case of sapphire substrates, a liquid etchant 504 may comprise the aforementioned sulfuric acid/phosphoric acid mixture. This etchant may etch the substrate 500 so as to define certain crystallographic planes that form the sidewalls 406a.

FIG. 5c depicts a later stage of processing in which the substrate 500 has been further etched to the point at which the peaked features 404 of FIG. 4b are fully formed. The set of mask features 502 may be subsequently removed before epitaxial growth or implantation.

Figure 6A:
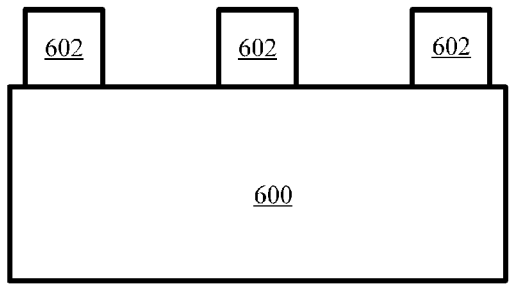
Figure 6B:
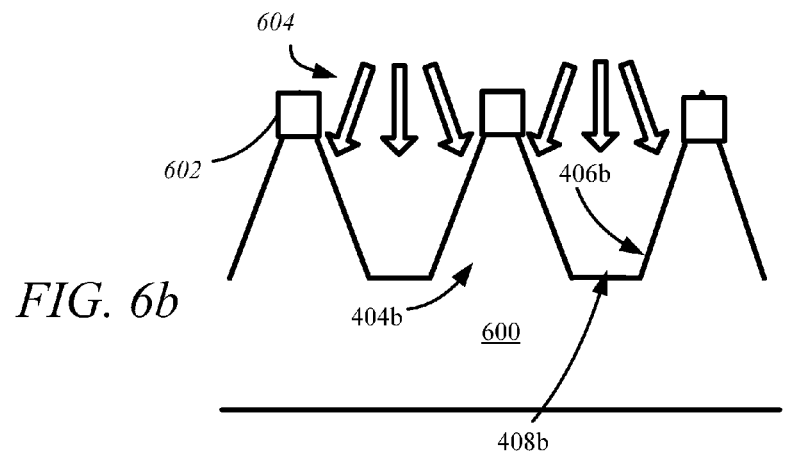
Figure 6C:
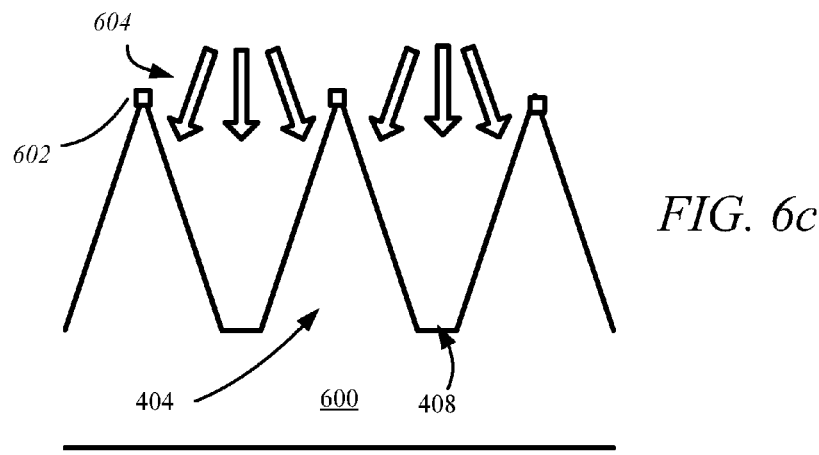

In another variant, the peaked features 404 may be produced by dry etching, as illustrated in FIGS. 6a-6c. When dry etching processes such as reactive ion etching, ion beam etching, or reactive ion beam etching, are used in conjunction with a patterned mask, such as photoresist, the resulting sidewall profile shape may vary according to the exact dry etch process used. In some cases, a sloping profile, such as that illustrated in FIG. 4b may result. As shown in FIG. 6a, the substrate 600 is provided with a set of mask features 602, which may be photoresist. In FIG. 6b, the substrate 600 and set of mask features 602 are subjected to dry etching from species 604, which may comprise a mixture of ions and neutral gaseous species. The species 604 etch the substrate 600 so as to define the peaked features 404b, which have sloping sidewalls that 406b. As illustrated, the sloping sidewalls 406b, which have not merged, are separated by bases 408b. The dry etch process may be continued, leading to the structure depicted in FIG. 6c, in which the peaked features 404 have formed. The mask features 602 may be subsequently removed before epitaxial growth or implantation.

It is to be noted that the FIGS. 5a-5c and 6a-6c may be idealized in their depiction of the sidewall structure of the peaked features 404. In particular, the exact shapes of sidewalls produced by wet etching may vary from those produced by dry etch processes, as is known in the art.

Figure 7A:
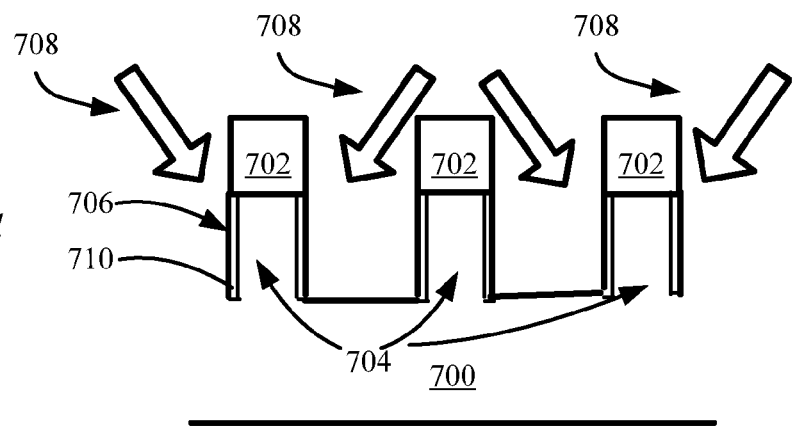
FIGS. 7a-7b depict another exemplary method.
Figure 7B:
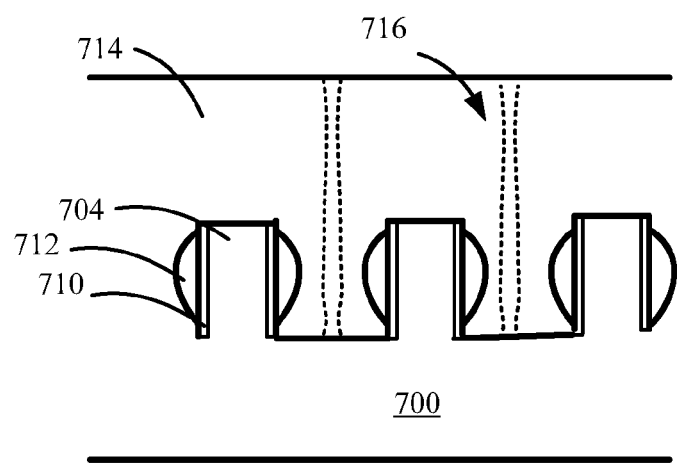

In still further embodiments, PSS substrates having features that exhibit vertical sidewalls are produced. The term "vertical sidewalls" as used herein refers to sidewalls forming an angle of about 80 to 100 degrees with respect to the plane of the substrate (see the x-y plane of FIG. 1c). In these embodiments, the sidewalls may still be implanted so as to create altered regions to enhance initial epitaxial growth on the sidewalls. FIG. 7a depicts an embodiment of implantation into vertical sidewalls of a PSS structure. As illustrated, the substrate 700 has been etched with mask features 702 in place to define features 704 having vertical sidewalls 706. The vertical sidewalls are then subject to an exposure to ions 708 represented by the arrows, which implant into vertical sidewalls 706, forming altered sidewall regions 710. In a subsequent step depicted at FIG. 7b, epitaxial growth of a layer 714 takes place. The presence of altered sidewall regions 710 promotes the formation of initial growth regions 712 along the vertical sidewalls 706 adjacent the altered sidewall regions 710. Subsequently, a continuous layer (layer 714) forms that may include threads 716 whose density is reduced as compared to a prior art process in which heteroepitaxy takes place on conventional PSS where sidewall ion implantation is not performed.

In additional embodiments, a PSS structure is subjected to multiple different exposures. In some embodiments, the angle of incidence of ions may be varied between exposures. In other embodiments, the species or ion may be varied between exposures. In other embodiments, the ion dose or the ion energy is varied between different exposures, is varied between different exposures, while in still other embodiments, a combination of any of the aforementioned parameters is varied between different ion exposures. This provides a flexible means to tailor the PSS structure and composition before heteroepitaxial growth is performed.

Figure 8A:
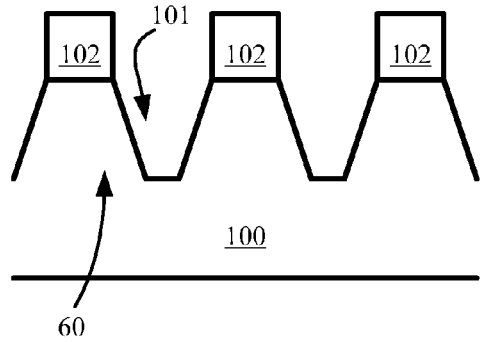
FIGS. 8a-8d depict still another exemplary method.
Figure 8B:
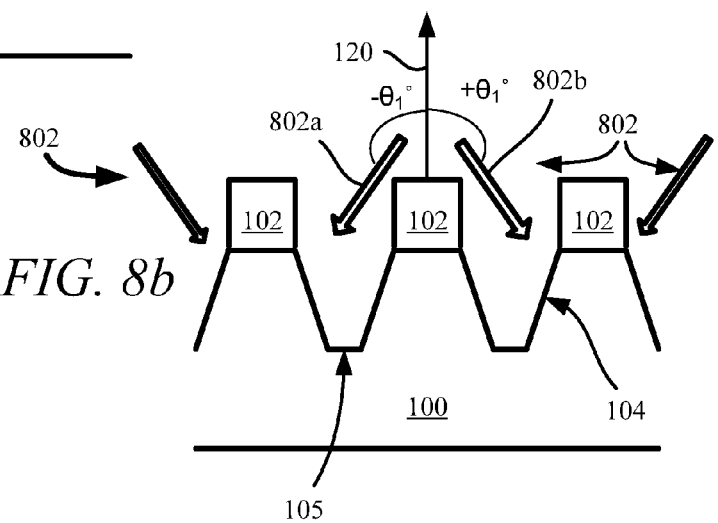

FIGS. 8a-8d depict an embodiment in which the angle of incidence of species, which may be ions, is varied between two different exposures. In FIG. 8a, a PSS 100 is illustrated that has been etched to form the features 60 with sloping sidewalls, as described above with respect to FIG. 1b. However, in other embodiments, the PSS may have features with vertical sidewalls. The features 60 are subject to a first exposure to ions 802 represented by the arrows, as shown in FIG. 8b. As detailed in FIG. 8b ions, such as ions 802a are directed at an angle $-\theta_1°$ with respect to perpendicular 120, while ions, such as ions 802b are directed at an angle $+\theta_1°$ with respect to perpendicular 120 to the plane of the substrate of the PSS 100, which may have the same absolute value as $-\theta_1°$ with respect to the perpendicular 120. For example, $-\theta_1°$ may be $-30°$ with respect to perpendicular 120, while $+\theta_2°$ may be $+30°$ with respect to perpendicular 120. In one embodiment, the exposure to ions 802 may take place in a single exposure that provides ions 802 simultaneously at different angles. For example, an apparatus as depicted with respect to FIG. 10a below may provide ions over a range of angles simultaneously to a substrate.

In other embodiments, the exposure to ions 802 depicted in FIG. 8b may take place in a series of at least two sub-exposures. In each sub exposure ions may be directed at a given angle of incidence, such that in a first sub-exposure the ions are directed at the angle $-\theta_1°$ represented by ions 802a, in a second sub-exposure the ions are directed at the angle $+\theta_2°$ represented by ions 802b, and so forth.

The ions 802 may be directed at a set of angles toward the PSS 100 such that the ions 802 are shadowed by the set of mask features 102 and features 60 so that the ions 802 do not strike the bases 105. In this manner, the ions 802 may implant into the substrate primarily or only along sidewalls 104.

Figure 8C:
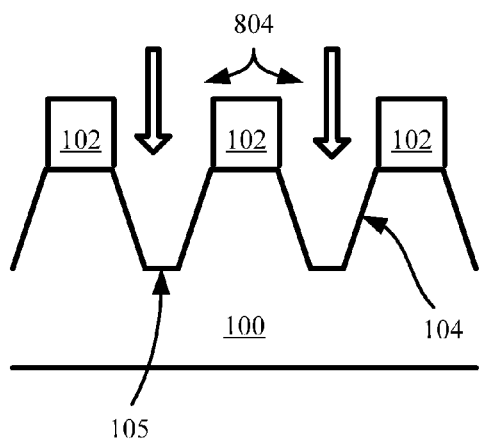

In a subsequent exposure shown in FIG. 8c, ions 804 are directed toward the PSS 100 along the perpendicular 120. In this manner, the ions 804 may strike the bases 105 and implant into the PSS through the bases 105. Depending upon the angle formed by the sidewalls 104 with respect to the perpendicular 120, the ions 804 may implant to a much lesser extent or not at all into the sidewalls 104. For example, although PSS 100 shows sloping sidewalls 104, a PSS whose features have vertical sidewalls may sustain little or no implantation in the sidewalls in the exposure illustrated in FIG. 8c.

Figure 8D:
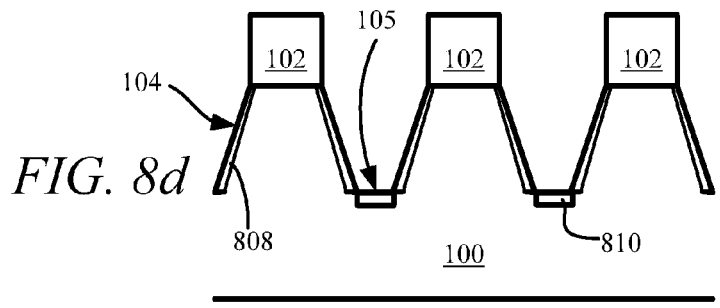

FIG. 8d depicts the structure of the PSS 100 after the exposure to ions 802 and ions 804. As illustrated, an altered sidewall region 808 is formed along the sidewalls 104 and an altered region 810 is formed in the bases 105. Consistent with the present embodiments, the ability to separately form altered regions in the sidewalls and the bases of the PSS structure facilitates the tailoring of subsequent epitaxial growth on the PSS. For example, the ions 802 may be tailored to produce an altered sidewall region 808 that facilitates the heteroepitaxial growth along the sidewalls 104 of large crystallites having low defect density. The altered sidewall region 808 may also facilitate more rapid initial growth of crystalline material along the sidewalls 104 as discussed previously. On the other hand, the ions 804 may be tailored to suppress growth of heteroepitaxial material from the bases 105, which may allow the growth of material from sidewalls 104 to dominate the growth process, at least initially, in one example.

In one embodiment, the dose of ions 802 implanted into sidewalls 104 may be less than or equal to the dose of ions 804 implanted into bases 105. In yet another embodiment, the PSS 100 is sapphire, and sidewalls 104 are implanted with ions 802 that constitute a first species, such as nitrogen, to enhance GaN growth. The bases 105, which also may have been implanted with this first species, are then implanted with ions 804 that constitute a second species that inhibits GaN growth, such as a noble gas, hydrogen, fluorine, chlorine, metals, or carbon, or with a species at a high enough dose to amorphize bases 105 and thereby inhibit GaN growth on bases 105. One possible mechanism that reduces or prevents compound semiconductor growth is that the compound semiconductor will preferentially deposit on a crystalline portion of the PSS 100 compared to an amorphous portion of the PSS 100. An implant may therefore be designed to cause amorphization of the PSS 100 in the bases 105. Another possible mechanism that reduces or prevents compound semiconductor growth relates to using a species that interferes with the nucleation of the compound semiconductor. Of course, other mechanisms are possible.

Figure 9A:
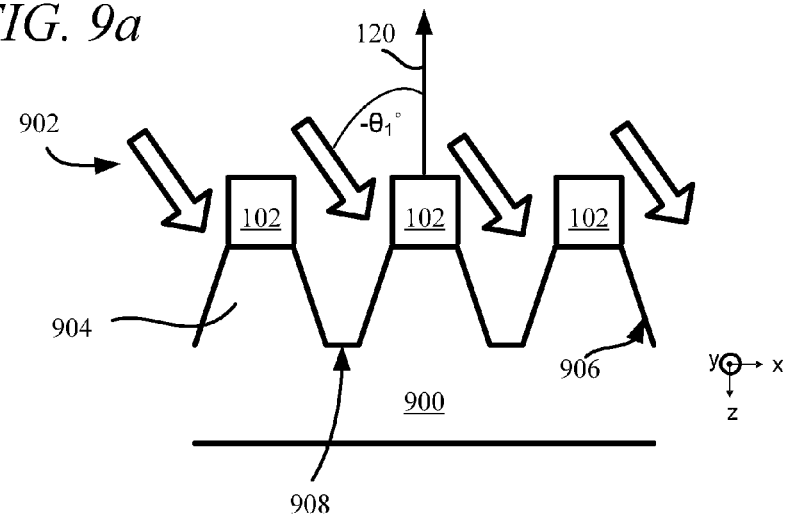
FIGS. 9a-9b depict details of geometry employed in an exemplary method.
Figure 9B:
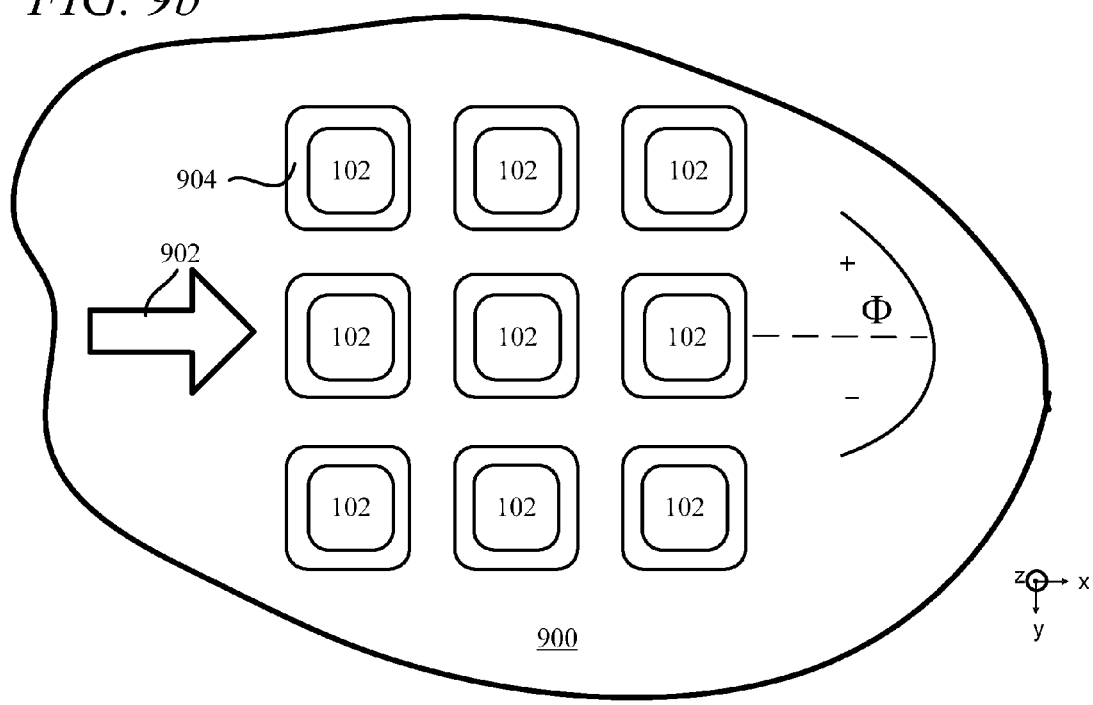

In various embodiments, the sidewalls of a PSS are implanted using an ion beam having a minimal ion spread such that ions are directed in a parallel fashion at the sidewall. The PSS may be exposed to the ion beam in a series of exposures. In some embodiments, the angle θ of an ion beam with respect to the perpendicular to the substrate plane may be kept constant between exposures while the PSS substrate is rotated between exposures. Referring now to FIG. 9a there is depicted a PSS 900 having an array of patterned features 904 that have sidewalls 906 and are masked by the set of mask features 102. PSS 900 is exposed to an ion beam 902 in which the ions from an angle $-\theta_1°$ with respect to the perpendicular 120. Such an ion beam may be produced by a beam line ion implantation apparatus in various embodiments. Referring also to FIG. 9b, which depicts a plan view of the PSS 900, that is, the view within the x-y plane, the ion beam 902 may be arranged parallel to the x-direction. In a first implant (or exposure), the PSS 100 may be arranged as shown in FIG. 9b. Multiple successive exposures to ion beam 902 may then be performed in which the PSS 100 is rotated in the x-y plane through an angle Φ between exposures.

In some embodiments, between each exposure, the PSS 900 is rotated through an angle Φ that is equal to 90°. In one embodiment a total of four exposures are performed, while in another embodiment a total of eight exposures are performed. In the latter case, the PSS 900 is rotated through a 360 degree rotation twice, which allows the ions of ion beam 902 to implant each sidewall 906 twice. In other embodiments, the PSS 900 is rotated through an angle Φ that is equal to 45° between each exposure. A total of eight exposures may be performed in this embodiment in order to provide rotation of the PSS 900 through an entire 360 degree rotation.

In alternate embodiments, a combination of exposures may be performed in which the implanting species form a non-perpendicular angle with respect to the bases 908 and exposures in which the implanting species are perpendicular to the bases 908, in which PSS 900 rotation in the x-y plane is provided between exposures. This will enable a uniform implant of the PSS 900. To form an angled implant as generally illustrated at FIG. 9a, the PSS 900 may be tilted with respect to the ion beam 902, the ion beam 902 may be angled with respect to the surface of PSS 900, or a combination of such tilting and angling may occur.

In various additional embodiments, the structure of PSS 100 illustrated in FIG. 8d having multiple different altered regions may be produced by a combination of masking using photoresist or other masking, selective or patterned implantation of ions, or control of ions directed over an angular spread as further detailed below with respect to FIGS. 10a-10c.

Figure 10A:
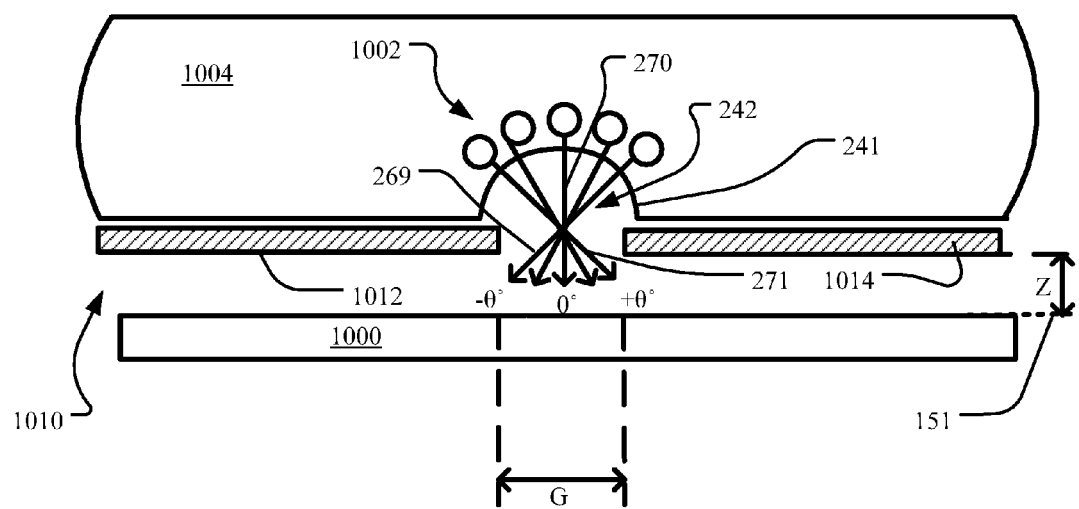
FIG. 10a depicts an exemplary apparatus.

FIG. 10a is a block diagram of a plasma processing apparatus having a plasma sheath modifier. The plasma 1004 is generated as is known in the art. This plasma 1004 is generally a quasi-neutral collection of ions and electrons. The ions typically have a positive charge while the electrons have a negative charge. The plasma 1004 may have an electric field of, for example, approximately 0 V/cm in the bulk of the plasma 1004. In a system containing the plasma 1004, ions 1002 from the plasma 1004 are attracted toward a substrate, such as PSS 1000, which may be or contain the PSS 100 or some other PSS. These ions 1002 may be attracted with sufficient energy to be implanted into the PSS 1000. The plasma 1004 is bounded by a region proximate the PSS 1000 referred to as a plasma sheath 242. The plasma sheath 242 is a region that has fewer electrons than the plasma 1004. Hence, the differences between the negative and positive charges cause a sheath potential in the plasma sheath 242. The light emission from this plasma sheath 242 is less intense than the plasma 1004 because fewer electrons are present and, hence, few excitation-relaxation collisions occur. Thus, the plasma sheath 242 is sometimes referred to as "dark space."

The plasma sheath modifier 1010 is configured to modify an electric field within the plasma sheath 242 to control a shape of a plasma sheath boundary 241 between the plasma 1004 and the plasma sheath 242. Accordingly, ions 1002 that are attracted from the plasma 1004 across the plasma sheath 242 may strike the PSS 1000 at a large range of incident angles. This plasma sheath modifier 1010 may be referred to as, for example, a focusing plate or sheath engineering plate.

In the embodiment of FIG. 10a, the plasma sheath modifier 1010 includes a pair of panels 1012 and 1014 defining an aperture there between having a horizontal spacing (G). The panels 1012 and 1014 may be an insulator, semiconductor, or conductor. In other embodiments, the plasma sheath modifier 1010 may include only one panel or more than two panels. The panels 1012 and 1014 may be a pair of sheets having a thin, flat shape. In other embodiments, the panels 1012 and 1014 may be other shapes such as tube-shaped, wedge-shaped, and/or have a beveled edge proximate the aperture. The panels 1012 and 1014 also may be positioned a vertical spacing (Z) above the plane 151 defined by the front surface of the PSS 1000. In one embodiment, the vertical spacing (Z) may be about 1.0 to 10.0 mm.

Ions 1002 may be attracted from the plasma 1004 across the plasma sheath 242 by different mechanisms. In one instance, the PSS 1000 is biased to attract ions 1002 from the plasma 1004 across the plasma sheath 242. In another instance, a plasma source that generates the plasma 1004 and walls surrounding the plasma 1004 are biased positively and the substrate PSS 1000 may be grounded. The biasing may be pulsed in one particular embodiment. In yet another instance, electric or magnetic fields are used to attract ions 1002 from the plasma 1004 toward the PSS 1000.

Advantageously, the plasma sheath modifier 1010 modifies the electric field within the plasma sheath 242 to control a shape of the plasma sheath boundary 241 between the plasma 1004 and the plasma sheath 242. The plasma sheath boundary 241 between the plasma 1004 and the plasma sheath 242 may have a convex shape relative to the plane 151 in one instance. When the PSS 1000 is biased, for example, the ions 1002 are attracted across the plasma sheath 242 through the aperture between the panels 1012 and 1014 at a large range of incident angles. For instance, ions 1002 following trajectory path 271 may strike the PSS 1000 at an angle of +θ° relative to the plane 151. Ions 1002 following trajectory path 270 may strike the PSS 1000 at about an angle of 0° relative to the same plane 151. Ions 1002 following trajectory path 269 may strike the PSS 1000 an angle of −θ° relative to the plane 151. Accordingly, the range of incident angles may be between +θ° and −θ° centered about 0°. In addition, some ion trajectories paths such as trajectory paths 269 and 271 may cross each other. Depending on a number of factors including, but not limited to, the horizontal spacing (G) between the panels 1012 and 1014, the vertical spacing (Z) of the panels 1012 and 1014 above the plane 151, the dielectric constant of the panels 1012 and 1014, plasma power, or other process parameters of the plasma 1004, the range of incident angles (θ) may be between +60° and −60° centered about 0°.

In particular, the apparatus of FIG. 10a provides the ability to tailor the trajectories of ions 1002 so that the distribution of angles of incidence of the ions 1002 upon the PSS 1000 may be changed to suit a desired profile. Thus, consistent with various embodiments, the trajectories may be tailored to produce incidence angle(s) close to perpendicular to the plane 151, or to produce ions that are at more glancing angles with respect to plane 151. Moreover, the distributions of incidence angles may be more narrowly peaked, or may be broad, the frequency of the distribution of incidence angles of ions may be peaked about a single value or may be bimodal in different examples. Referring again to FIG. 1c, in this manner, the incidence angle(s) of ions 103 may be tailored to a desired distribution to selectively implant into a desired portion of a PSS, such as the sidewalls 104.

Figure 10B:
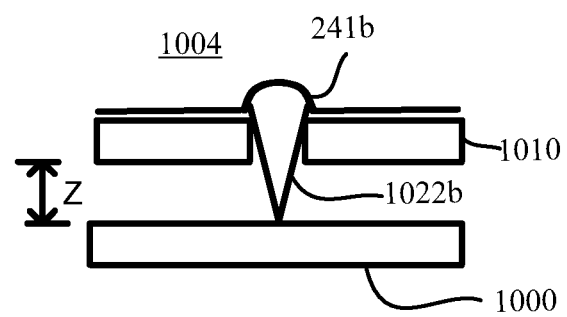
Figure 10C:
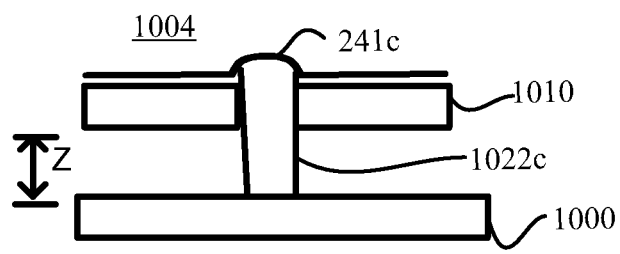

FIGS. 10b-10c depict respective exemplary ion profiles 1022b-1022c at different plasma power levels for ions accelerated from the plasma 1004 through the plasma sheath modifier 1010 in accordance with embodiments of the disclosure. As illustrated, the ion profiles 1022b, and 1022c, may result from varying the plasma power levels in the apparatus discussed above with respect to FIG. 10a. In the lower power level arrangement depicted at FIG. 10b, a plasma sheath boundary 241b has a relatively stronger curvature that results in extraction of ions from the plasma 1004 over a relatively larger range of angles such that the ions in ion profile 1022b impact the PSS 900 over a relatively larger range of angles. In the higher power level arrangement of FIG. 10c, a plasma sheath boundary 241c has a relatively lesser curvature that results in extraction of ions from the plasma 1004 over a relatively smaller range of angles such that the ions in ion profile 1022c impact the PSS 1000 over a relatively smaller range of angles, which may be peaked about a perpendicular to the plane 151, in contrast to the ion profile 1022b, which may provide a greater number of ions at incidence angles, such as about 30 to 60 degrees with respect to the plane 151.

Continuing with the example generally illustrated at FIGS. 8a-8d, in one particular embodiment, angular spread control is used to implant the sidewalls 104 with a higher dose of a first species than that implanted into the bases 105, such as by employing a wider angle spread in a first exposure. The angular spread control may be obtained by using the processing apparatus of FIG. 10a in one example. Thus, the trajectories of ions 802 may represent the predominant trajectories of ions using the apparatus of FIG. 10a under a set of conditions that produces a broad angular distribution of ions, such as a lower plasma power level. In a particular example, the broad angular distribution may be a bimodal distribution of angles of incidence of ions that is peaked at angles between about +/−10 to +/−70 degrees from the perpendicular 120. This type of distribution may be effective in selectively implanting the sidewalls 104 in comparison to other surfaces of a PSS 100. Subsequently, an implant perpendicular to the bases 105 is performed to implant the bases 105 with a higher dose of the second species than that received by the sidewalls 104. For example, to implant the second species, the apparatus of FIG. 10a may be tuned to produce a narrow distribution of angles about the perpendicular 120, as suggested by the higher power scenario of FIG. 10c. While some first species may be implanted in the bases 105 and second species in the sidewalls 104, this may be minimized to still produce the desired effect for enhancing quality of heteroepitaxial growth disclosed in the embodiments herein.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of growing a heteroepitaxial layer, comprising:
   providing a substrate containing patterned features having sidewalls;
   directing ions toward the sidewalls in an exposure, wherein altered sidewall regions are formed; and
   depositing the heteroepitaxial layer under a set of deposition conditions effective to preferentially promote epitaxial growth on the sidewalls in comparison to other surfaces of the patterned features.

2. The method of claim 1 wherein the providing the substrate comprises:
   providing a set of mask features on the substrate; and
   etching the substrate to define the set of patterned features within the substrate.

3. The method of claim 2 wherein the directing the ions takes place while the set of mask features is disposed on the substrate, the method further comprising removing the set of mask features before the depositing the heteroeptiaxial layer.

4. The method of claim 2 wherein the set of mask features is photoresist.

5. The method of claim 1 wherein the sidewalls are at a non-perpendicular angle with respect to a surface of the substrate.

6. The method of claim 1 wherein the heteroepitaxial layer comprises a compound semiconductor.

7. The method of claim 6 wherein the heteroepitaxial layer comprises a Ga:N material.

8. The method of claim 1 wherein the substrate comprises single crystalline silicon or single crystalline sapphire.

9. The method of claim 1, wherein the exposure is a first set of exposures, the ions are first ions, and the first set of exposures comprises one or more exposures in which the first ions have an angle of incidence having a common absolute value with respect to a perpendicular to a surface of the substrate, the method further comprising directing second ions toward the substrate in a second exposure at a second angle of incidence with respect to the perpendicular that is different from the first angle of incidence.

10. The method of claim 9 wherein the first ions differ from the second ions in one or more of: ion dose, ion energy, ion species, and range of angles of incidence.

11. The method of claim 1 wherein the ions comprise an ion energy of about 5 keV to 150 keV and an ion dose between approximately $1E14\ cm^{-2}$ to $5E16\ cm^{-2}$.

12. The method of claim 1 wherein the patterned features comprise a two dimensional array of features in the substrate having a diameter of about 1.0 µm to 5 µm, a height of about 0.3 µm to 2.5 µm, and spacing of about 1 µm to 5 µm.

13. The method of claim 1 wherein the depositing the heteroepitaxial layer comprises employing metal organic chemical vapor deposition (MOCVD).

14. A method of heteroepitaxial growth of a material on a substrate having a surface, comprising:
   forming in the substrate a two dimensional array of patterned features that are characterized by sidewalls disposed at a non-perpendicular angle to the surface of the substrate;
   implanting ions into the sidewalls in a set of exposures, the ions defining a non-zero angle with respect to at least one sidewall in each exposure of the set of exposures;
   depositing the material on the sidewalls under deposition conditions effective for heteroepitaxial growth of the material, wherein the material is formed, at least initially, preferentially upon the sidewalls in comparison to other surfaces of the substrate.

15. The method of claim 14, the material comprising a Ga:N material, and the substrate comprising single crystalline silicon or single crystalline sapphire.

16. The method of claim 14, wherein the set of exposures comprise an angle of incidence having a common absolute value with respect to a perpendicular to the surface of the substrate, the method further comprising directing second ions toward the substrate at an angle perpendicular to the surface.

17. The method of claim 16, wherein the first ions differ from the second ions in one or more of: ion dose, ion energy, ion species, and range of angles of incidence.

18. The method of claim 16, wherein the first ions promote heteroepitaxial growth on the sidewalls, and the second ions inhibit heteroepitaxial growth on surfaces of bases of valleys of the substrate that are disposed between the patterned features.

19. The method of claim 16, wherein the material comprises gallium nitride, the substrate comprises sapphire, the first ions comprise nitrogen and the second ions comprise an inert gas.

20. A light emitting diode device comprising:
   a substrate comprising a first material patterned into a two-dimensional array of peaked features having sidewalls, the sidewalls having implanted regions that include implanted species dispersed within the first material; and
   a device component comprising an epitaxial layer disposed on the patterned substrate, the epitaxial layer comprising a plurality of initial growth regions, each initial growth region disposed adjacent a sidewall of a peaked feature, wherein the implanted species comprising a concentration in a range of $1 \times 10^{20}$ to $1 \times 10^{22}$ per cubic centimeter.

21. The light emitting diode device of claim 20 wherein the device component comprising a Ga:N material, and the substrate comprising monocrystalline silicon or monocrystalline sapphire.

22. The light emitting diode device of claim 20 wherein the two dimensional array of features having a diameter of about 1.0 µm to 5 µm and a height of about 0.3 µm to 2.5 µm.

23. A method of growing a heteroepitaxial layer, comprising:
   providing a substrate containing patterned features having sidewalls;
   directing ions toward the sidewalls in an exposure, wherein altered sidewall regions are formed; and
   depositing the heteroepitaxial layer under a set of deposition conditions effective to preferentially promote epitaxial growth on the sidewalls in comparison to other surfaces of the patterned features,
   wherein the exposure is a first set of exposures, the ions are first ions, and the first set of exposures comprises one or more exposures in which the first ions have an angle of incidence having a common absolute value with respect to a perpendicular to a surface of the substrate, the method further comprising directing second ions toward the substrate in a second exposure at a second angle of incidence with respect to the perpendicular that is different from the first angle of incidence, and
   wherein the first ions promote preferential heteroepitaxial growth on the sidewalls, and the second ions inhibit heteroepitaxial growth on surfaces of the substrate other than the sidewalls.

24. The method of claim 23, wherein the heteroepitaxial layer comprises gallium nitride, the substrate comprises sapphire, the first ions comprise nitrogen and the second ions comprise an inert gas.

* * * * *